United States Patent
Sirbu et al.

(10) Patent No.: US 10,601,201 B1
(45) Date of Patent: Mar. 24, 2020

(54) TUNABLE VERTICAL-CAVITY SURFACE-EMITTING LASER

(71) Applicant: Mellanox Technologies, Ltd., Yokneam (IL)

(72) Inventors: Alexei Sirbu, Cugy (CH); Vladimir Iakovlev, Yokneam (CH); Yuri Berk, Kiryat Tivon (IL); Sylvie Rockman, Zichron Yaakov (IL); Elad Mentovich, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 16/288,847

(22) Filed: Feb. 28, 2019

(51) Int. Cl.
*H01S 5/42* (2006.01)
*H01S 5/183* (2006.01)
*H01S 5/00* (2006.01)
*H01S 5/02* (2006.01)
*H01S 5/022* (2006.01)

(52) U.S. Cl.
CPC ............ *H01S 5/423* (2013.01); *H01S 5/0064* (2013.01); *H01S 5/0203* (2013.01); *H01S 5/02296* (2013.01); *H01S 5/18341* (2013.01); *H01S 5/18344* (2013.01); *H01S 5/18375* (2013.01); *H01S 5/18394* (2013.01)

(58) Field of Classification Search
CPC ... H01S 5/0064; H01S 5/0203; H01S 5/02296
See application file for complete search history.

(56) References Cited

U.S. PATENT DOCUMENTS

| 6,750,071 B2* | 6/2004 | Chirovsky | .......... H01S 5/18341 438/22 |
| 2003/0031221 A1* | 2/2003 | Wang | .................. H01S 5/18366 372/45.01 |
| 2008/0137692 A1* | 6/2008 | Park | ....................... B82Y 20/00 372/4 |

OTHER PUBLICATIONS

Paul et al., *10 Gbit/s Direct Modulation of Widely Tunable 1550-nm MEMS VCSEL*, IEEE Journal of Selected Topics in Quantum Electronics, vol. 21, No. 6, (2015), 10 pages.

* cited by examiner

Primary Examiner — Tuan N Nguyen
(74) Attorney, Agent, or Firm — Alston & Bird LLP (57) ABSTRACT

A vertical cavity surface emitting laser (VCSEL) array is provided. Each tunable VCSEL includes an output coupling mirror; a high reflectivity mirror; an active cavity material structure disposed between the output coupling mirror and the high reflectivity mirror; and a spacer layer disposed between the output coupling mirror and the active cavity material. A tuning cavity is defined within the spacer layer. Each VCSEL further includes a first contact pad and a second contact pad designed to receive a driving voltage; a tuning electrode on a first surface of the output coupling mirror for tuning the emission wavelength to a distinct wavelength.

20 Claims, 7 Drawing Sheets

TUNABLE VERTICAL-CAVITY SURFACE-EMITTING LASER

FIELD

Embodiments of the present invention relate generally to a tunable vertical-cavity surface-emitting laser (VCSEL) with an Indium phosphide (InP) based active region in which an emission aperture is defined by an overgrown tunnel junction. Example embodiments relate generally to tunable VCSELs that are configured to be mounted in a VCSEL array. Example embodiments relate also to multi-beam emission devices comprising a monolithic VCSEL array.

BACKGROUND

As data communication demands increase in both volume and speed, fiber optics have become an increasingly popular communication approach. One emerging element of this approach for generating the data stream communicated through fiber optics cables comprises a VCSEL optically coupled with a single mode fiber. However, emitting a single channel along fiber optics cable is insufficient to meet current and growing optical communication demands. Techniques for multiplexing multiple channels into one single mode fiber have been developed, such as wavelength division multiplexing (WDM). These techniques require sufficient spread between the wavelengths of the signals being multiplexed together to allow for appropriate demultiplexing by the receiver. However, traditional monolithic arrays of traditional VCSELs tend to comprise VCSELs that all emit at about the same wavelength. This wavelength is set by the thickness of epitaxial layers that constitute the VCSEL cavity. Some variation of emission wavelength of adjacent devices of an array can be reached by operating the active region of the VCSELs at different temperatures. However, this variation in the wavelength is insufficient to allow for reliable optical communication at sufficient bandwidth to meet the current and growing optical communication bandwidth demand.

BRIEF SUMMARY OF SOME EXAMPLE EMBODIMENTS

Example embodiments of the present invention provide a tunable VCSEL. In various embodiments, the emission wavelength $\lambda'$ of the tunable VCSEL may be tuned up to 100 nm from the nominal wavelength $\lambda$ of the VCSEL. Example embodiments of the present invention provide multi-beam emission devices comprising an array of VCSELs (e.g., a monolithic VCSEL array) comprising a plurality of tunable VCSELs such that the multi-beam emission device may be operated to emit a set of distinct wavelengths. For example, a multi-beam emission device comprising an array of eight tunable VCSELs (e.g., a monolithic VCSEL array of eight VCSELs) may be provided, and the multi-beam emission device may be operated to emit a set of eight distinct wavelengths, two sets of four distinct wavelengths, and/or the like. Various embodiments of the present invention provide a method for manufacturing a tunable VCSEL. Such tunable VCSELs, host substrate-mounted VCSELs, and multi-beam emitting devices may be used in a variety of applications, such as, for example, fiber optic data transmission in high-speed single mode fiber optic communication systems. In an example embodiment, the host substrate is a host wafer and/or a circuit board, such as a printed circuit board. In various embodiments, a tunable VCSEL comprises a VCSEL cavity having an adjustable length. In various embodiments, the length of the VCSEL cavity of the tunable VCSEL is adjusted by applying a tuning voltage to a tuning electrode affixed to and/or deposited on a flexible output coupling mirror of the VCSEL such that the flexible coupling mirror flexes into a gas-filled space provided by a tuning cavity defined with a spacer layer of the VCSEL. In various embodiments, the tuning cavity is provided along the emission axis of the VCSEL such that the tuning cavity is aligned with the active region material structure comprising the active region and the tunnel junction of the VCSEL.

In an example embodiment, the tunable VCSEL comprises an emission structure comprising a flexible output coupling mirror, a high reflectivity mirror, an active cavity material structure positioned between the output coupling mirror and the high reflectivity mirror, and a tuning cavity defined in a spacer layer disposed between the output coupling mirror and the active cavity material structure. In various embodiments, the active cavity material structure comprises a top current-spreading layer, a bottom current-spreading layer, an active region disposed between the top current-spreading layer and the bottom current-spreading layer, and a tunnel junction overgrown by the top current-spreading layer, with the tunnel junction disposed adjacent to the active region.

In various embodiments, the light emitted by the tunable VCSEL is characterized by a wavelength in the range comprising a lower wavelength boundary of 1200 nanometers (nm) and an upper wavelength boundary of 1900 nm. For example, the radiation emitted by the tunable VCSEL may be characterized by a wavelength of approximately 1310 nm, in an example embodiment. In some examples, the emitted laser light is configured to transmit data at a data transmission rate greater than 25 gigabits per second. Example embodiments enable reaching and/or surpassing 50 Gb/s using non-return-to-zero (NRZ) modulation and 100 Gb/s using four level pulse-amplitude-modulation (PAM-4) on the transmitter optical sub-assembly (TOSA) level.

According to a first aspect of the present invention, a tunable VCSEL is provided. In an example embodiment, the tunable VCSEL comprises an output coupling mirror; a high reflectivity mirror; an active cavity material structure disposed between the output coupling mirror and the high reflectivity mirror; and a spacer layer disposed between the output coupling mirror and the active cavity material. A tuning cavity is defined within the spacer layer. The tuning cavity is disposed along the emission axis of the VCSEL, wherein a wavelength of light emitted by the VCSEL is tunable via application of a tuning voltage to a tuning electrode of the VCSEL. The active cavity material structure comprises a first current-spreading layer, a second current-spreading layer, an active region disposed between the first current-spreading layer and the second current-spreading layer, and a tunnel junction overgrown by the second current-spreading layer, wherein the tunnel junction is disposed adjacent the active region.

According to another aspect of the present invention, a VCSEL array of a multi-beam emission device is provided. In an example embodiment, the VCSEL array comprises a plurality of tunable VCSELs mounted to a host wafer. Each tunable VCSEL comprises an output coupling mirror; a high reflectivity mirror; an active cavity material structure disposed between the output coupling mirror and the high reflectivity mirror, the active cavity material structure; a spacer layer disposed between the output coupling mirror and the active cavity material and having a tuning cavity defined therein. The tuning cavity is disposed along the emission axis of the VCSEL, and the spacer layer is disposed on second surface of the output coupling mirror. Each VCSEL further comprises a tuning electrode disposed on a first surface of the output coupling mirror, the first surface of the output coupling mirror being opposite the second surface of the output coupling mirror; a first contact pad and a second contact pad, the first and second contact pads comprising an anode contact pad and a cathode contact pad, where the first contact is in electrical communication with the first current-spreading layer and the second contact is in electrical communication with the second current-spreading layer. A wavelength of light emitted by the VCSEL is tunable via application of a tuning voltage to the tuning electrode of the VCSEL. The active cavity material structure comprises a first current-spreading layer, a second current-spreading layer, an active region disposed between the first current-spreading layer and the second current-spreading layer, and a tunnel junction overgrown by the second current-spreading layer, wherein the tunnel junction is disposed adjacent the active region. The first and second contact pads are secured in electrical communication with a pair of leads corresponding to a driver of the plurality of drivers. A third metal pad disposed on the emission mesa may be secured to a pad of the host wafer to provide mechanical stability to the VCSEL mounted to the host wafer. The tuning electrode is in electrical communication with a tuning voltage supplier of the one or more tuning voltage suppliers. The plurality of VCSELs and the one or more tuning voltage suppliers are configured such that each VCSEL emits light of a distinct wavelength.

According to yet another aspect of the present invention, a method for manufacturing a tunable VCSEL (e.g., for inclusion in a monolithic VCSEL array and/or a multi-beam emission device) is provided. In an example embodiment, the method for manufacturing a tunable VCSEL comprises providing a partial reflector-VCSEL blank. The partial reflector-VCSEL blank comprises a spacer layer blank, an etch stop layer, a partial reflector blank, and an active cavity material structure blank disposed between the etch stop layer and the partial reflector blank, the etch stop layer disposed between the spacer layer blank and the active cavity material structure, wherein the spacer layer blank, the etch stop layer, the active cavity material structure blank, and the partial reflector blank are stacked in a direction along an emission of axis the VCSEL. The method further comprises etching the spacer layer blank and the etch stop layer to define a tuning cavity within the spacer layer blank; bonding an output coupling mirror to a surface of the spacer layer opposite the etch stop layer; and etching the partial reflector blank and the active cavity material structure blank to form an emission structure. The emission structure comprises a partial reflector, a first current-spreading layer, a second current-spreading layer, an active region disposed between the first current-spreading layer and the second current-spreading layer, and a tunnel junction overgrown by the second current-spreading layer, wherein the tunnel junction is disposed adjacent the active region. The method further comprises depositing first and second contact pads, and a tuning electrode, where the first contact pad is in electrical communication with the first current-spreading layer, the second contact pad is in electrical communication with the second current-spreading layer, and the tuning electrode defines a cavity length that defines an emission wavelength of the VCSEL. Application of a tuning voltage to the tuning electrode causes tuning of a wavelength of light emitted by the VCSEL.

BRIEF DESCRIPTION OF THE DRAWING(S)

Having thus described the invention in general terms, reference will now be made to the accompanying drawings, which are not necessarily drawn to scale, and wherein:

FIG. 11A is a side view and FIG. 11B is a top view.

DETAILED DESCRIPTION OF SOME EXAMPLE EMBODIMENTS

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current-spreading layer" may be used to describe a current-spreading layer; however, the current-spreading layer may be on the top or on the bottom, depending on the orientation of the particular item being described. The term "approximately" is used herein to mean within manufacturing and/or engineering standards and/or tolerances. As used herein, the first surface of a layer is the surface of the layer perpendicular to the emission axis of the VCSEL that is closer to the emission aperture of the VCSEL and the second surface of a layer is the surface of the layer perpendicular to the emission axis of the VCSEL that is farther from the emission aperture of the VCSEL.

Figure 1:
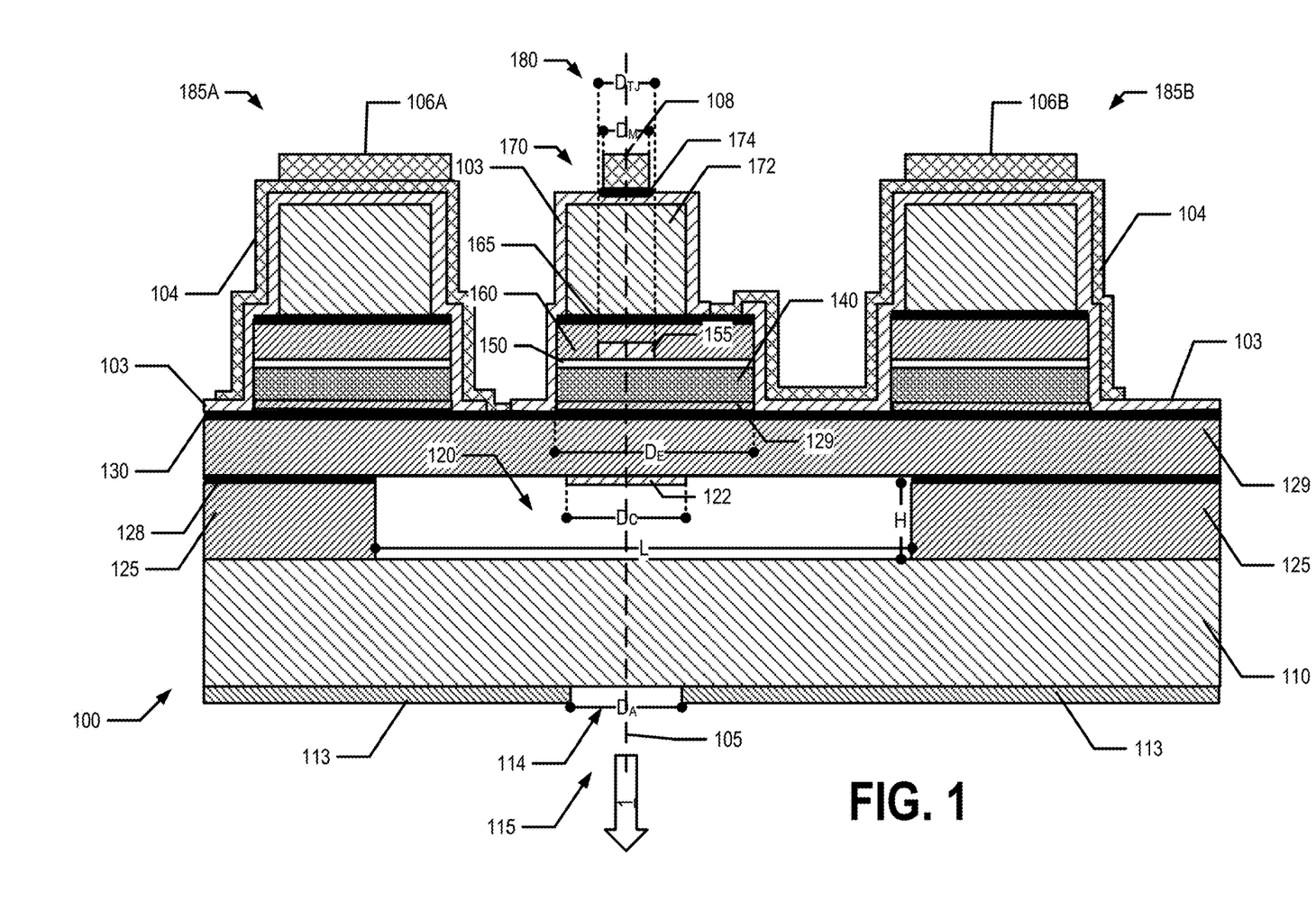
FIG. 1 illustrates a schematic cross-section of a VCSEL, according to an example embodiment.

Various embodiments provide a tunable VCSEL, a board mounted tunable VCSEL, a multi-beam emission device comprising a plurality of tunable VCSELs, and corresponding methods of manufacturing and/or use. FIG. 1 illustrates an example tunable VCSEL 100. In various embodiments, a tunable VCSEL 100 comprises a flexible output coupling mirror 110, a high reflectivity mirror 170, and an active cavity material structure 145 configured to emit light 1 (e.g., electromagnetic radiation, laser light) at a nominal wavelength λ. In an example embodiment, the tunable VCSEL 100 further comprises a spacer layer 125 having a tuning cavity 120 defined, etched, and/or disposed therein and a tuning electrode 113 such that the VCSEL 100 may be tuned to emit light 1 at an emission wavelength λ'. In various embodiments, by applying a tuning voltage $V_t$ of up to 10V, the emission wavelength λ' may be shifted up to approximately 100 nm from the nominal wavelength λ.

Figure 2:
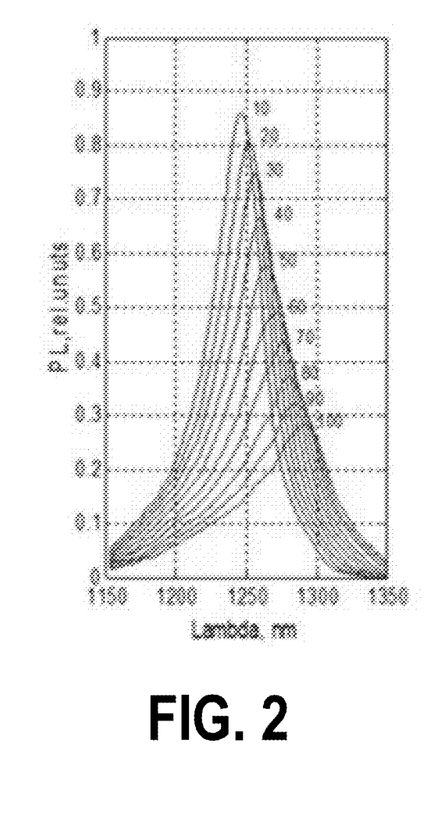
FIG. 2 provides a graph showing the photoluminescence spectra of an InAlGaAs quantum well at different temperatures.
Figure 3:
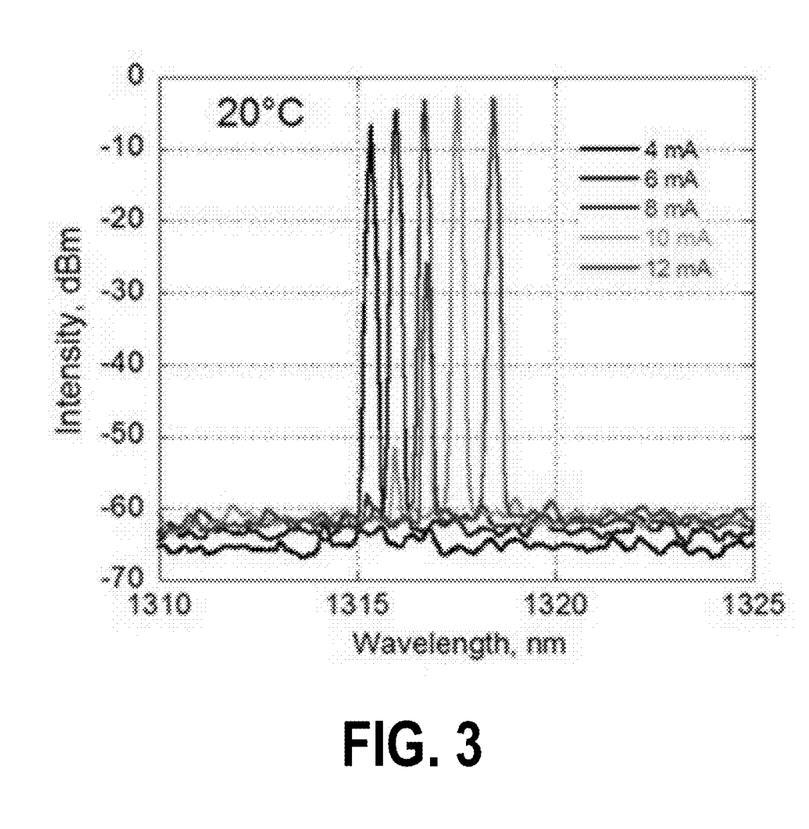
FIG. 3 provides a graph showing the variation of emission wavelength of a traditional VCSEL with respect to bias current.

The tunable VCSEL 100 provides a solution to a technical challenge of fiber optic transmission, as defined by IEEE standard 400GBASE-LR8. For example, the tunable VCSEL 100 addresses the challenge of transmitting 400 Gbps over one single mode fiber in eight wavelength division multiplexing (WDM) channels and/or lanes. The wavelength range for the eight channels or lanes covers nearly 40 nm from about 1272 nm to 1310 nm. FIG. 2 shows the photoluminescence spectra at different temperatures of InAlGaAs quantum wells of traditional 1310 nm VCSELs that was published in literature (see, for example, A. Sirbu et al., High performance wafer-fused semiconductor disc lasers emitting in the 1310 nm waveband, Optics Express, vol. 22, No 24, p. 29398, 2014). As can be seen in FIG. 2, the maximum of the photoluminescence at room temperature (20° C.) is set at 1250 nm. At about 100° C., the temperature of the quantum wells of electrically pumped VCSELs, the maximum of the photoluminescence spectral distribution shifts to about 1290 nm. Normally, the VCSEL cavity of the VCSEL is set to achieve laser emission at about this wavelength. AlGaAs/GaAs based DBRs used in the mirrors of these VCSELs are also designed to have the center of high reflectivity band close to the emission wavelength. Some variation of emission wavelength of adjacent devices of an array of VCSELs can be reached by biasing VCSELs at different currents that will result in different temperatures of the active region and consequently in different emission wavelengths because of the refractive index of the active region and/or mirrors varying with temperature. But emission wavelength variation with current/temperature that was published in literature (see, for example, A. Mereuta et al., 10 Gbps and 10 km error-free transmission up to 100° C. with 1.3 μm wafer fused VCSELs, Optics Express, vol. 17, No 15, p. 12981, 2009) is limited only to about several nanometers as can be seen in FIG. 3.

Previous attempts to provide a tunable VCSEL have resulted in a number of disadvantages that limit application of such devices in monolithic arrays of WDM VCSELs for fiber optic communications. For example, in such previous attempts at a tunable VCSEL, it is not possible to precisely set the emission wavelength at zero tuning voltage because an air-gap of the VCSEL is defined by the thickness of a sacrificial Ni layer that is typically deposited by sputtering, plus some deformation of dielectric membrane DBR after its release that depends on the built-in strain in the DBR. Both thickness control of Ni during sputtering and membrane deformation at its release result in a high off-set of emission wavelength at zero voltage compared with the design value. In previous attempts at a tunable VCSEL, the anode, cathode, and flexible output coupling mirror are placed on the same side of the VCSEL. As a result it is quite problematic to reduce the size of the VCSEL to 250 μm in order match a 250 μm pitch of standard single mode ribbon fiber arrays for parallel optics links. The smallest VCSEL size with dielectric movable DBRs that was published in literature (see, for example, Sujoy Paul et al., 10-Gb/s Direct Modulation of Widely Tunable 1550-nm MEMS VCSEL, IEEE Journal of Selected Topics in Quantum Electronics, vol. 21, No. 6, p. 1700908, 2015) is 420×420 μm². Additionally, the previous attempt at a tunable VCSEL described by Sujoy Paul et al. comprises two dielectric DBRs and a gold substrate. This VCSEL configuration has failed to demonstrate the reliability that is required for fiber optics communication applications. So far, reliable operation of fiber-optic communication VCSELs has only been demonstrated with VCSELs comprising AlGaAs/GaAs DBRs and a GaAs substrate.

The tunable VCSEL 100 of the present invention overcomes the disadvantages of previous attempts of tunable VCSELs by providing a VCSEL with a nominal emission wavelength setting at zero voltage (applied to a tuning electrode, for example) with less than 2% error because the air gap thickness is defined by a InP spacer layer that is grown epitaxially with a precision better than 2%. Various embodiments of the tunable VCSEL 100 may be sized to 250 μm for use with standard single mode ribbon fiber arrays for parallel optics links. Moreover, various embodiments of the tunable VCSEL 100 demonstrate appropriate reliability for use in fiber optics communication applications. Thus, various embodiments of the tunable VCSEL 100 provide an improvement over existing technology.

Example Tunable VCSEL

Figure 9:
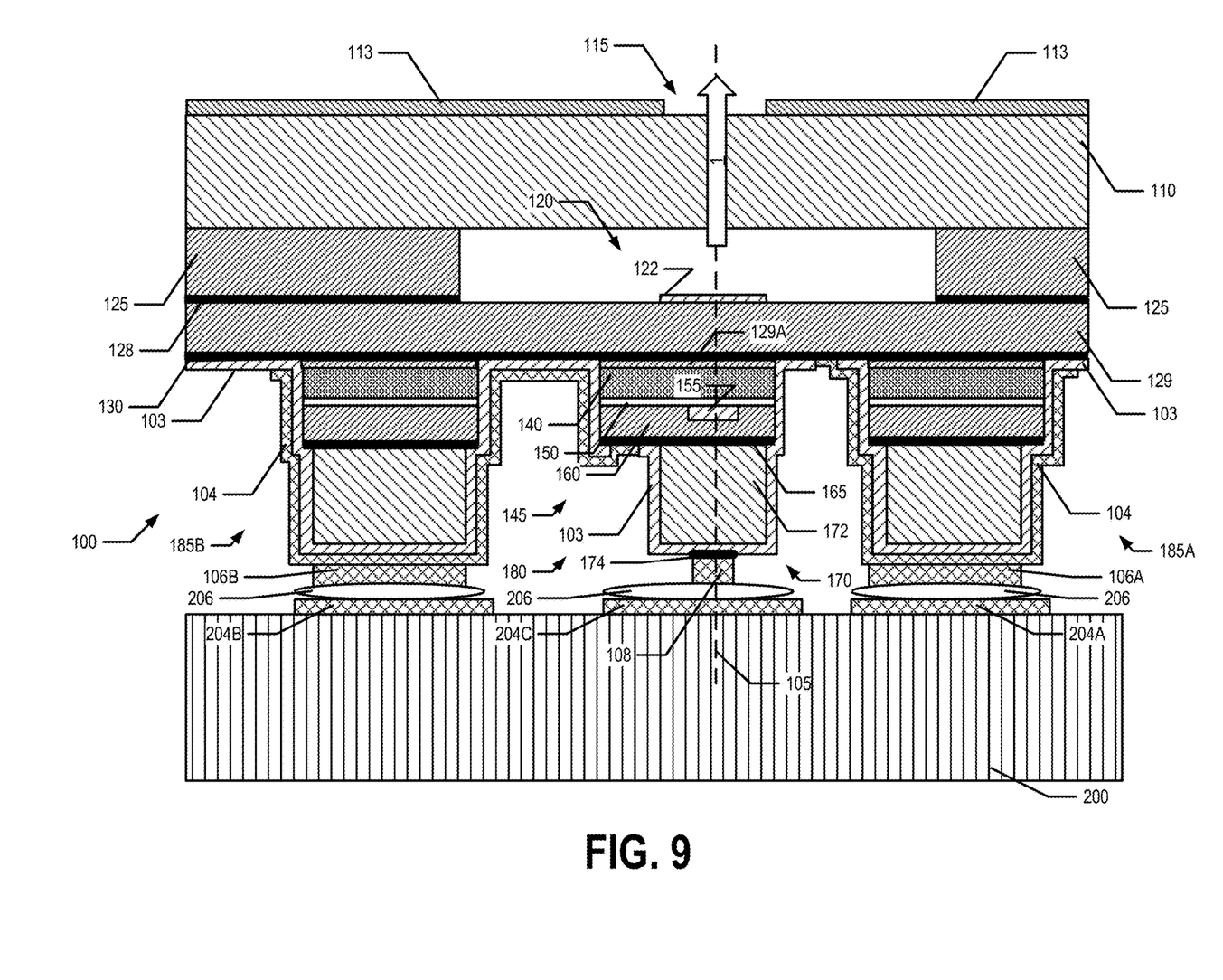
FIG. 9 illustrates a schematic cross-section of a VCSEL mounted to a board, according to an example embodiment.

FIG. 1 illustrates a schematic cross-section of an example embodiment of a vertical-cavity surface-emitting laser (VCSEL) 100. In various embodiments, the VCSEL 100 comprises an output coupling mirror 110, a high reflectivity mirror 170, and an active cavity material structure 145. In various embodiments, the high reflectivity mirror 170 and the active cavity material structure 145 are located on an emission mesa 180 of the VCSEL 100. In various embodiments, the VCSEL 100 may have further first and second contact pads 106A, 106B, a third metal pad 108, conductive layers 104, a dielectric material 103, a spacer layer 125 having a tuning cavity 120 defined therein, and/or the like. In various embodiments, the tuning cavity 120 is a gas-filled cavity within the spacer layer 125. For example, in an example embodiment, the tuning cavity 120 is filled with air. In various embodiments, the VCSEL 100 may further comprise a tuning electrode 113 comprising a window 114 (see FIG. 9) that is concentric with the emission aperture 115 defined by the overgrown tunnel junction of the VCSEL 100.

In various embodiments, the active cavity material structure 145 comprises a first current-spreading layer 129, a second current-spreading layer 160, an active region 140 disposed between the first current-spreading layer 129 and the second current-spreading layer 160, and a tunnel junction 155 overgrown by the second current-spreading layer 160, wherein the tunnel junction 155 is disposed adjacent the active region 140. In an example embodiment, the active cavity material structure 145 further comprises a p-type layer 150 sandwiched between the active region 140 and the second current-spreading layer 160. In various embodiments, the first and second current-spreading layers 129, 160 are n-type InP layers. In an example embodiment, the active cavity material structure 145 further comprises a first contact layer 130 and a second contact layer 165. In various embodiments, the first contact layer 130 and the second contact layer 165 are made of n-type InGaAsP.

In an example embodiment, the output coupling mirror 110 comprises a semiconductor distributed Bragg reflector (DBR). In various embodiments, the high reflectivity mirror 170 comprises a composite mirror. In an example embodiment, the composite mirror comprises a partial reflector 172 and a metal reflector 174. In various embodiments, the partial reflector 172 and the metal reflector 174 may be separated by a layer dielectric material 103. In various embodiments, the size and shape of metal reflector 174 may be used for mode and/or polarization selection such that the VCSEL 100 provides radiation of a selected mode (e.g., the fundamental mode) and a selected polarization. In an example embodiment, the partial reflector 172 may be used for mode selection such that the VCSEL 100 provides radiation of a selected mode (e.g., the fundamental mode).

In various embodiments, laser light 1 is emitted from the VCSEL 100 through the emission window 115. The light emitted by the VCSEL 100 defines a light emission axis 105 of the VCSEL 1. Various elements of the example VCSEL 100 will now be described in more detail.

In various embodiments, the VCSEL 100 comprises an output coupling mirror 110. In various embodiments, a tuning electrode 113 is deposited on a first surface of the output coupling mirror 110. In various embodiments, the output coupling mirror 110 is a flexible mirror such that application of a tuning voltage to the tuning electrode 113 causes the output coupling mirror 110 to flex and adjust the height H of the tuning cavity 120 so as to tune the wavelength of light 1 emitted by the VCSEL 100. For example, the VCSEL 100 may have a nominal wavelength λ of 1310 nm and be tuned to an emission wavelength λ' of the VCSEL 100. In various embodiments, the wavelength shift Δλ between the nominal wavelength and the emission wavelength of the VCSEL 100 is $\Delta\lambda=|\lambda-\lambda'|\leq 100$ nm. In an example embodiment, the maximum wavelength shift $\lambda_{max}$ (e.g., the free spectral range) is $\Delta\lambda_{max}=\lambda^2/(2C)$, where C is the cavity length of the VCSEL 100 (e.g., the sum of the height H of the tuning cavity 120 and the optical length of the active region 140 and tunnel junction 155, first current-spreading layer 129, second current-spreading layer 160 and the effective penetration depth of the electromagnetic field in the output coupling mirror 110 and the effective penetration depth of the electromagnetic field in the high reflectivity mirror 170). The effective penetration depth of the electromagnetic field for GaAs based DBR reflectors is known to be equal to 800 nm.

In an example embodiment, a second surface of the output coupling mirror 110 is opposite the first surface of the output coupling mirror in a direction defined by and/or parallel to the emission axis 105. In various embodiments, at least a portion of a second surface of the output coupling mirror 22 is adjacent, affixed to, abuts, and/or is otherwise positioned with respect to the spacer layer 125 having the tuning cavity 120 defined therein. In an example embodiment, the output coupling mirror 110 comprises an un-doped semiconductor distributed Bragg reflector (DBR) mirror and/or dielectric reflector stacks. For example, the output coupling mirror 110 may comprise un-doped alternating layers of aluminum gallium arsenide (AlGaAs) and gallium arsenide (GaAs). In an example embodiment, the output coupling mirror 110 has approximately 98% reflectivity from the perspective of the active region 140. In an example embodiment, the output coupling mirror 110 comprises 25 pairs of layers of GaAs/AlGaAs. For example, the output coupling mirror 110 may comprise 25 layers of GaAs and 25 layers of AlGaAs wherein the layers are disposed such that the layers alternate between a GaAs layer and an AlGaAs. For example, a pair of layers consists of a GaAs layer and an abutting AlGaAs layer. In an example embodiment, the thickness of each layer is approximately one-fourth λ/n, where λ is the wavelength of light 1 emitted by the VCSEL 100 and n is the refractive index of the semiconductor of that layer.

In various embodiments, the VCSEL 100 comprises a high reflectivity mirror 170. In an example embodiment, the high reflectivity mirror 170 is a composite mirror. In an example embodiment, the composite mirror comprises a partial reflector 172 and a metal reflector 174. In an example embodiment, the partial reflector 172 and the metal reflector 174 are separated by the layer of dielectric material 103. In various embodiments, a first surface of the partial reflector 172 is adjacent, affixed to, abuts, and/or is otherwise positioned with respect to the second contact layer 165. In an example embodiment, a second surface of the partial reflector 172 is opposite the first surface of the partial reflector 172 in a direction defined by and/or parallel to the light emission axis 105. In various embodiments, at least a portion of a second surface of the partial reflector 172 is adjacent, affixed to, abuts, and/or is otherwise positioned with respect to a layer of dielectric material 103. In an example embodiment, the partial reflector 172 comprises an un-doped DBR mirror, dielectric stacks, and/or the like. For example, the partial reflector 172 may comprise un-doped alternating layers of AlGaAs and GaAs. In an example embodiment, the partial reflector 172 has approximately 80% reflectivity from the perspective of active region 140. In an example embodiment, the partial reflector 172 comprises 10 pairs of layers of GaAs/AlGaAs. For example, the partial reflector 172 may comprise 10 layers of GaAs and 10 layers of AlGaAs wherein the layers are disposed such that the layers alternate between a GaAs layer and an AlGaAs. For example, a pair of layers consists of a GaAs layer and an abutting AlGaAs layer. In an example embodiment, the thickness of each layer is approximately one-fourth λ/n, where λ is the nominal wavelength of the VCSEL 100 and n is the refractive index of the semiconductor of that layer.

As noted above, the reflectivity of the partial reflector 172 is approximately 80% from the perspective of the active region 140, in various embodiments. In various embodiments, the reflectivity of the high reflectivity mirror 170 is up to approximately 100%. As noted above, the metal reflector 174 is disposed on the second surface of the partial reflector 172 and/or separated from the second surface of the partial reflector 172 by, for example, a layer of dielectric material 103. In an example embodiment, the metal reflector comprises a first layer comprising and/or consisting of titanium (Ti) and a second layer comprising and/or consisting of gold (Au). In an example embodiment, the second layer has a greater thickness in a direction corresponding and/or parallel to the emission axis 105 than the first layer. In an example embodiment, the first layer consists of Ti and is 5 nm thick in a direction corresponding and/or parallel to the emission axis 105 and the second layer consists of Au and is 100 nm thick in the direction corresponding and/or parallel to the emission axis 105. Because of a very low thickness of the first layer, the first layer (e.g., a Ti adhesion layer) approximately does not induce additional optical absorption.

In a plane perpendicular to the emission axis 150, the metal reflector 174 defines a metal reflector diameter $D_M$. Similarly, in a plane perpendicular to the emission axis 105, the tunnel junction 155 defines a tunnel junction diameter $D_{TJ}$. In various embodiments, the metal reflector diameter $D_M$ is in the range of approximately one-third of the tunnel junction diameter $D_{TJ}$ and the tunnel junction diameter $D_{TJ}$ (e.g. $D_{TJ}/3 \leq D_M \leq D_{TJ}$). In an example embodiment, the metal reflector diameter $D_M$ is 3 nm and the tunnel junction diameter $D_{TJ}$ is 6 nm. In an example embodiment, the metal reflector diameter $D_M$ is selected so as to suppress and/or decrease reflection of higher modes of the radiation or light 1 emitted from the VCSEL 100. For example, the metal reflector diameter $D_M$ may be selected to reduce the reflection of higher modes of radiation while still reflecting a significant portion (e.g., approximately 99.9%) of the fundamental mode of the radiation. In an example embodiment, the radiation (e.g., the fundamental mode radiation and/or higher mode radiation) and/or a portion thereof that is leaked by and/or around the metal reflector 174 may be captured and used for power monitoring, in an example embodiment. In an example embodiment, in a plane perpendicular to the emission axis 105, the metal reflector 174 defines a circle. In an example embodiment, in a plane perpendicular to the emission axis 105, the metal reflector 174 defines an ellipse or other non-circular shape. In an example embodiment, the shape defined by the metal reflector 174 in a plane perpendicular to the emission axis 105 is selected so as to select a particular polarization of radiation to be emitted by the VCSEL 100. For example, the shape of the metal reflector 174 in a plane perpendicular to the emission axis 105 may cause a particular polarization of radiation to be reflected more efficiently than other polarizations of the radiation, thereby suppressing the other polarizations and effectively selecting the particular polarization for emission from the VCSEL 100 (e.g., via emission aperture 115).

In various embodiments, the high reflectivity mirror 170 is a composite mirror comprising a layer of dielectric material 103 sandwiched, at least in part, between the partial reflector 172 and the metal reflector 174. In an example embodiment, the dielectric material 103 may be silicon nitride ($Si_3N_4$) or other dielectric and/or insulating material. In an example embodiment, the thickness of the layer of dielectric material 103 in a direction corresponding and/or parallel to the emission axis 105 is approximately 150 nm. In various embodiments, the thickness of the layer of dielectric material 103 in a direction corresponding and/or parallel to the emission axis 105 is approximately $0.22\lambda$, where $\lambda$ is the nominal wavelength that characterizes the emission and/or light 1. For example, if $\lambda=1310$ nm, the thickness of the layer of dielectric material 103 is approximately 150 nm.

In various embodiments, the VCSEL 100 comprises first and second contact pads 106A and 106B. For example, the first contact pad 106A may be an anode contact and the second contact pad 106B may be a cathode contact. For example, the first and second contact pads 106A, 106B may comprise an anode contact pad and a cathode contact pad. The first contact pad 106A is in electrical communication with a first contact layer 130 and the second contact pad 106B is in electrical communication with a second contact layer 165. In various embodiments, when two elements are in electrical communication with one another, electrical signals, current, and/or the like may pass from one of the elements into the active region and to the other element. In various embodiments, the first and/or second contact layer 130, 165 comprises an indium gallium arsenide phosphide (InGaAsP) layer. In various embodiments, the first and second contact layers 130, 165 are configured to provide electrical signals, current, voltage, and/or the like applied to the first and second contact pads 106A, 106B to the active cavity material structure 145 (e.g., first and second current-spreading layers 129, 160).

In example embodiments, the active cavity material structure 145 comprises a first current-spreading layer 129, a second current-spreading layer 160, an active region 140 disposed between the first current-spreading layer 129 and the second current-spreading layer 160, and a tunnel junction 155 overgrown by the second current-spreading layer 160, wherein the tunnel junction 155 is disposed adjacent to and/or abuts the active region 140 (e.g., at the second surface of the active region 140) and/or a p-type layer 150 disposed and/or is sandwiched between the active region 140 and the second current-spreading layer 160. In various embodiments, the first contact layer 130 (which is in electrical communication with the first contact pad 106A via a conductive layer 104) is in electrical communication with the first current-spreading layer 129 and the second contact layer 165 (which is in electrical communication with the second contact pad 106B via a conductive layer 104) is in electrical communication with the second current-spreading layer 160.

In various embodiments, the first and second current-spreading layers 129, 160 comprise n-type indium phosphide (n-InP) layers. In various embodiments, providing the electrical contacting through n-type first and second current-spreading layers 129, 160 allows for the output coupling mirror 110 and the partial reflector 172 to each comprise un-doped DBR mirrors or dielectric reflector stacks, as described elsewhere herein. In an example embodiment, the first current-spreading layer 129 further comprises layer 129A such that the first contact layer 130 is partially embedded and/or disposed within the first current-spreading layer 129.

In various embodiments, a tunnel junction 155 is embedded and/or disposed within the second current-spreading layer 160. In an example embodiment, the tunnel junction 155 is a mesa etched in the p++/n++ tunnel junction. In an example embodiment, the tunnel junction 155 comprises a heavily doped p++/n++ indium aluminum gallium arsenide tunnel junction. In various embodiments, a reverse biased p-n junction blocks the current around the tunnel junction when a direct voltage is applied to the VCSEL 100 (e.g., via the first and second contact pads 106A, 106B). In various embodiments, the tunnel junction 155 serves a dual role of optical (photon) and electrical (current) confinement. The tunnel junction 155 may, for example, be embedded in an overgrown region which provides both current and photon confinement. In this example, the current is confined by the reverse p-n junction that is formed at the interface between the second current-spreading layer 160 and a p-type layer 150 comprising a second surface of the active region 140. The optical confinement is defined by the tunnel junction 155 representing an optical aperture for emitting radiation and/or light 1 and is determined by the width or diameter of the tunnel junction 155 (e.g., the tunnel junction diameter $D_{TJ}$) in a plane perpendicular to the emission axis 105.

In various embodiments, the active region 140 is sandwiched and/or disposed between the first and second current-spreading layers 129, 160. In various embodiments, the active region 140 is in electrical communication with the first and second current-spreading layers 129, 160. In various embodiments, the active region 140 comprises a plurality of quantum wells, where radiation and/or light 1 is generated, between the output coupling mirror 110 and high reflectivity mirror 170. In some various embodiments, the active region 140 may comprise a multi-quantum well (MQW) layer stack comprising a series of quantum wells disposed between a series of barriers and a p-type layer 150 disposed between the second current-spreading layer 160 and the MQW layer stack. For example, a second surface of the active region 140 may comprise a p-type layer 150. In an example embodiment, the series of quantum wells and barriers may comprise six un-doped compressively strained, indium aluminum gallium arsenide (InAlGaAs) quantum wells and seven tensile strained InAlGaAs barriers.

In various embodiments, the VCSEL 100 may comprise dielectric material 103. For example, the VCSEL 100 may comprise dielectric material 103 configured to electrically isolate the first and second contact pads 106A, 106B, the first and second current-spreading layers 129, 160, and the emission structure. In an example embodiment, the dielectric material comprises and/or consists of $Si_3N_4$ and/or other dielectric and/or insulating materials. In various embodiments, the layer thickness of dielectric material 103 may be approximately 150 nm.

In various embodiments, the active cavity material structure 145 forms a mesa 180 with the high reflectivity mirror 170 disposed, positioned, affixed to, and/or otherwise positioned with respect to the top of the mesa 180. In various embodiments, the mesa 180 is formed on top of the underlying structures, such as, for example, the spacer layer 125 and the output coupling mirror 110. An example manufacturing process of a VCSEL 100 can include reactive ion etching (RIE) and chemical etching through the various layers to cause the formation of the mesa 180, in an example embodiment.

In various embodiments, the VCSEL 100 further comprises first and second structural mesas 185A, 185B. In an example embodiment, the first contact pad 106A is disposed and/or deposited on the first structural mesa 185A and the second contact pad 106B is disposed and/or deposited on the second structural mesa 185B. When the VCSEL 100 is mounted to a host wafer 200 (See FIG. 9), the first and second structural mesas 185A, 185B may be configured to support the VCSEL 100, at least in part, in an appropriate position. For example, the first and second contact pads 106A, 106B may be mechanically secured and/or affixed to contacts, pads, conductive lines, and/or the like on the host wafer 200. The first and second structural mesas 185A, 185B may comprise conductive layers 104 (e.g., so as to place the first and second contact pads 106A, 106B in electrical communication with the first and second contact layers 130, 165), dielectric material 103 (e.g., so as to insulate the first and second contact pads 106A, 106B and the conductive layers 104 from various other elements of the VCSEL 100), and/or other layers. The emission mesa 180 is disposed between the first and second structural mesas 185A, 185B. For example, the emission mesa 180 may comprise the high reflectivity mirror 170 and the active cavity material structure 145. In an example embodiment, the emission mesa 180 further comprises a third metal pad 108, dielectric material 103, and/or the like.

In various embodiments, the first and second structural mesas 185A, 185B and the emission mesa 180 are disposed on and/or affixed to the first current-spreading layer 129. For example, the first and second structural mesas 185A, 185B and the emission mesa 180 extend out from a second surface of the first current-spreading layer 129, in an example embodiment. In an example embodiment, an etch stop layer 128 is adjacent to, affixed to, and/or abuts a first surface of the first current-spreading layer 129, the first surface of the first current-spreading layer 129 being opposite the second surface of the first current-spreading layer 129 in a direction that corresponds to and/or is parallel to the emission axis 105. In an example embodiment, the etch stop layer 128 is made of a material featuring etch characteristics that are distinct from the InP material of spacer layer 125. For example, the etch stop layer 128 may be used and/or configured to stop the etching of the spacer layer 125. In various embodiments, the etch stop layer 128 and/or a portion thereof (e.g., the portion within the tuning cavity 120) is also etched such that the tuning cavity is defined, at least in part, by the first surface of the first current-spreading layer 129. In various embodiments, the spacer layer 125 is adjacent, affixed to, and/or abuts the etch stop layer 128 opposite the first current-spreading layer 129. For example, the spacer layer 125 is sandwiched between the output coupling mirror 110 and the etch stop layer 128 is affixed to, adjacent to, and/or abutting the first current-spreading layer 129.

In an example embodiment, a tuning cavity 120 is etched and/or defined within the spacer layer 125. In various embodiments, the tuning cavity 120 may be filled with gas. For example, the tuning cavity 120 may be filled with air. In various embodiments, the tuning cavity 120 has a height H, measured in a direction of corresponding to and/or parallel to the emission axis 105, that is set to approximately $\lambda/2$, where $\lambda$ is the nominal wavelength of the VCSEL 100 in the gas that fills the tuning cavity 120. For example, the height H of the spacer layer is approximately $\lambda/2$, in various embodiments. In various embodiments the height H of the spacer layer is approximately $\lambda$, or $3\lambda/2$. In various embodiments, the tuning cavity 120 has a length L, measured in a direction perpendicular to the emission axis 105, that is greater than the tunnel junction diameter $D_{TJ}$ and/or the metal reflector diameter $D_M$. In an example embodiment, the emission mesa 180 has an emission mesa diameter $D_E$ in a direction perpendicular to the emission axis 105. In an example embodiment, the length L of the tuning cavity 120 is larger than the emission mesa diameter $D_E$. For example, the spacer layer 125 may be configured to maintain a spacing of height H between the first current-spreading layer 129 and the output coupling mirror 110 in the vicinity of the first and second structural mesas 185A, 185B. In an example embodiment, the spacer layer 125 is a layer of InP material.

In an example embodiment, the tuning cavity 120 is part of the VCSEL cavity of the VCSEL 100. In an example embodiment, when a tuning voltage is applied to the tuning electrode 113, the flexible output coupling mirror 110 may be electrostatically displaced so as to change the height H of the tuning cavity from approximately $\lambda/2$ to approximately $\lambda'/2$, where $\lambda'$ is the nominal wavelength of the VCSEL 100 (in the gas that is inside the tuning cavity 120) and $\lambda'$ is the emission wavelength of the VCSEL 100 (e.g., the characteristic wavelength of light emitted by the VCSEL 100) in the gas that is inside the tuning cavity 120. In various embodiments, the height H of the tuning cavity may be changed from $\lambda$ to $\lambda'$ or from $3\lambda/2$ to $3\lambda'/2$ via application of a tuning voltage to the tuning electrode.

In an example embodiment, an anti-reflective coating 122 is applied to a portion of the first surface of the first current-spreading layer 129. For example, the first surface of the first current-spreading layer 129 may define a second boundary of the tuning cavity 120. The anti-reflective coating 122 is applied to the second boundary of the tuning cavity 120 such that the anti-reflective coating 122 is facing into the tuning cavity 120 (e.g., facing the second surface of the output coupling mirror 110). The anti-reflective coating 122 is configured to match the semiconductor and air cavities for reaching a maximum tuning range of the VCSEL 100. The refractive index of the antireflective coating $n_{AR}$ is $n_{AR}=\sqrt{n}$ where n is refractive index of the underlying current-spreading layer and the thickness of antireflective coating is set to $\lambda/4$ where $\lambda$ is the nominal emission wavelength of the VCSEL. The diameter of the anti-reflective coating 122 is the coating diameter $D_C$. In an example embodiment, the coating diameter $D_C$ is approximately equal to or greater than the emission mesa diameter $D_E$. In some embodiments, when it is not necessary to reach maximum tuning range, the anti-reflective coating layer is not deposited to simplify the fabrication of the VCSEL.

As noted above, a tuning electrode 113 may be affixed to, adjacent to, deposited on, and/or abut the first surface of the output coupling mirror 110. In various embodiments, the tuning electrode 113 is a metallic contact-tuning electrode. The flexible output coupling mirror 110 and the cathode contact (e.g., first contact pad 106A in an example embodiment) are electrically isolated. Thus, when a tuning voltage is applied to the tuning electrode 113, an electrostatic force acts on the flexible output coupling mirror 110 to cause the output coupling mirror 110 to flex and adjust the height H of the tuning cavity 120 in the vicinity of the anti-reflective coating 122 and the emission mesa 180. For example, the flexing of the output coupling mirror 110 in response to the tuning voltage applied to the tuning electrode 113 causes the cavity length of the VCSEL 100 to change (e.g., be reduced), thereby adjusting the emission wavelength $\lambda'$ of the VCSEL 100. In various embodiments, the tuning voltage is a voltage difference between the voltage applied to the tuning electrode and the voltage applied to the cathode contact pad (e.g., the first cathode pad 106A).

In various embodiments, a window 114 is defined in the tuning electrode 113. In various embodiments, the window 114 is a through hole that passes from a first surface to a second surface of the tuning electrode 113 along the emission axis 105 of the VCSEL 100. In an example embodiment, the window 114 is concentric with the emission aperture 115 defined by the overgrown tunnel junction mesa of the VCSEL 100. For example, the light 1 is emitted from the VCSEL 100 through the emission aperture 115 which is disposed concentrically with the window 114. In an example embodiment, the window 114 is larger than the emission aperture 115. The diameter of the window 114 is the aperture diameter DA. In various embodiments, the aperture diameter DA is approximately the same as the diameter of the antireflective coating $D_C$. In various embodiments, the diameter of the antireflective coating $D_C$ is greater than the window diameter DA. In various embodiments part of the output coupling mirror is etched to increase its flexibility and let air in/out of the tuning cavity 120.

Example Process for Manufacturing a VCSEL

Figure 4:
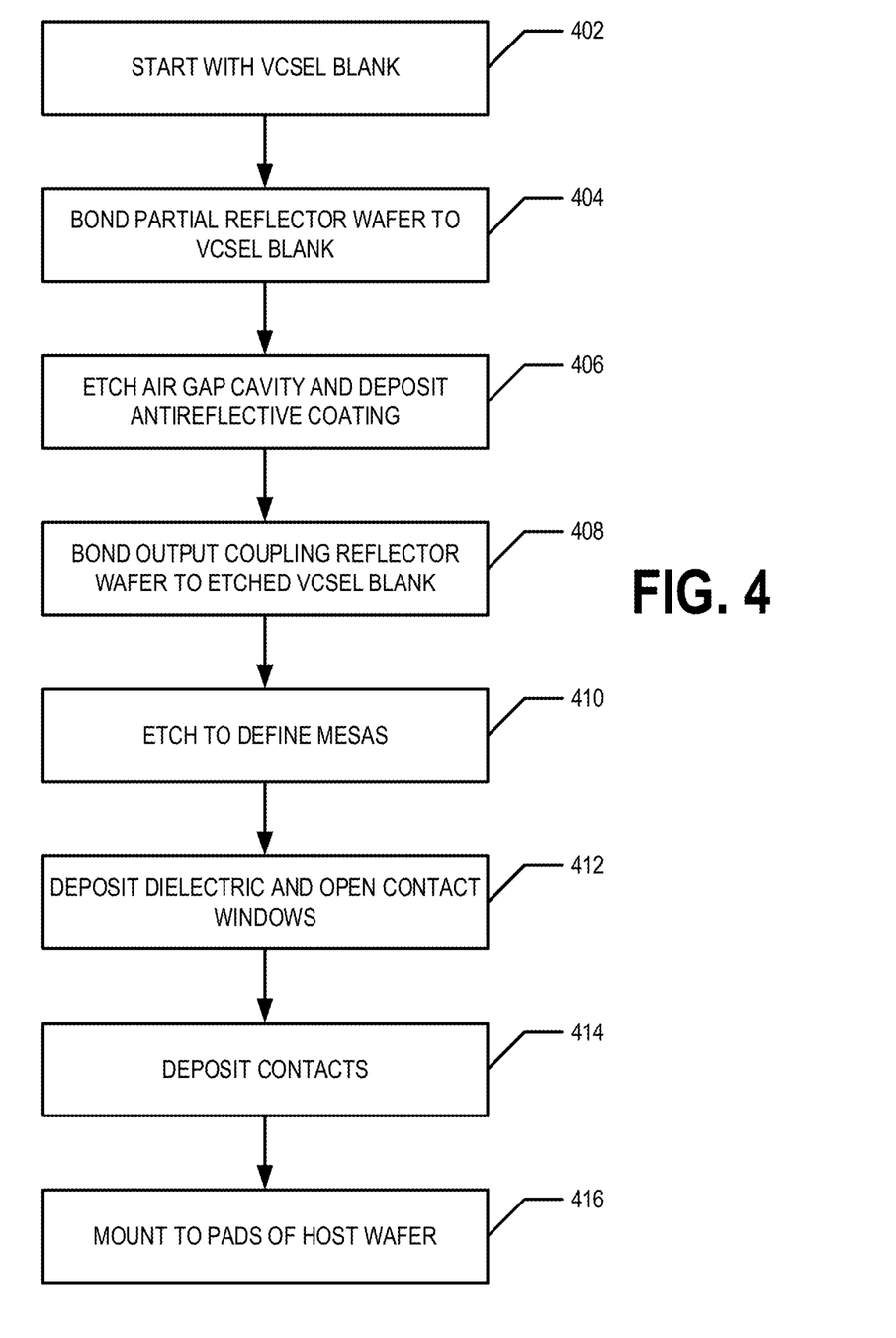
FIG. 4 provides a flowchart illustrating an example method for manufacturing a VCSEL, according to example embodiments.
Figure 5:
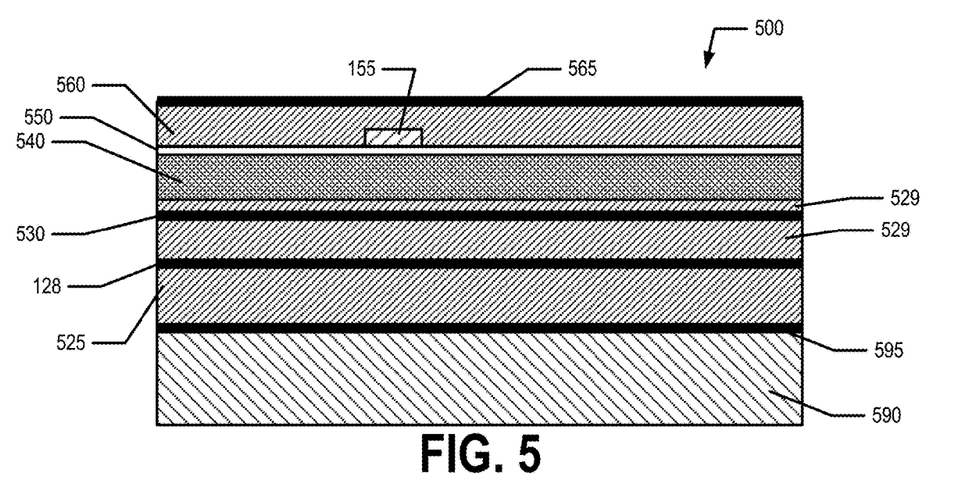
FIG. 5 illustrates a schematic cross-section of a VCSEL blank, according to an example embodiment.

FIG. 4 provides a flowchart illustrating an example process for manufacturing a VCSEL 100 and mounting the VCSEL 100 to a host wafer 200. At block 402, the process starts with a VCSEL blank 500. An example VCSEL blank 500 is shown in FIG. 5. In an example embodiment, the VCSEL blank 500 comprises a second contact layer blank 565, a second current-spreading layer blank 560 having the tunnel junction 155 overgrown therein, a p-type layer blank 550, an active region blank 540, a first contact layer blank 530, first current-spreading layer bank 529, an etch stop layer 128, a spacer layer blank 525, an etch stop layer 595, and a substrate 590. In an example embodiment, the substrate 590 is an InP substrate. In various embodiments, the second contact layer blank 565, second current-spreading layer blank 560, p-type layer blank 550, active region blank 540, first contact layer blank 530, first current-spreading layer bank 529, and spacer layer blank 525 are configured to be etched to generate the second contact layer 165, second current-spreading layer 160, p-type layer 150, active region 140, second contact layer 130, first current-spreading layer 129, and spacer layer blank 525, respectively. For example, the second contact layer blank 565, second current-spreading layer blank 560, p-type layer blank 550, active region blank 540, first contact layer blank 530, and first current-spreading layer bank 529 are configured to be etched to generate the first and second structural mesas 185A, 185B and the emission mesa 180.

Figure 6:
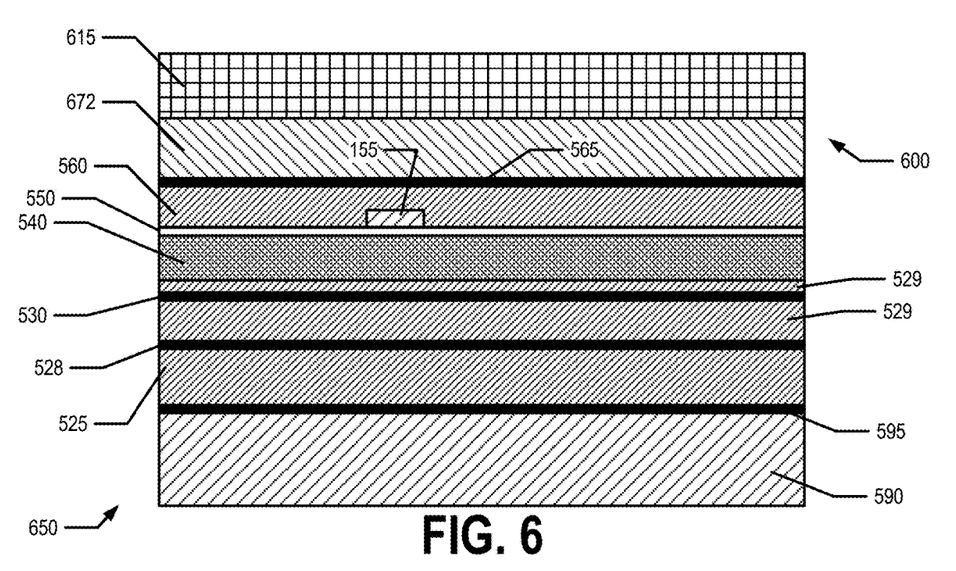
FIG. 6 illustrates a schematic cross-section of a partial reflector-VCSEL blank, according to an example embodiment.

Continuing with FIG. 4, at block 404, a partial mirror blank 600 is bonded to the VCSEL blank 500 to create a partial reflector-VCSEL blank 650, as shown in FIG. 6. In various embodiments, the partial reflector blank 600 comprises a partial reflector blank 672 and a substrate 615. In an example embodiment, the substrate 615 is a GaAs substrate. In various embodiments, the partial reflector blank 672 is configured to be etched to create the partial reflector 172. In an example embodiment, the partial reflector blank 672 is configured to be etched to provide a portion of each of the first and second structural mesas 185A, 185B and the emission mesa 180. In an example embodiment, the partial reflector blank 672 and/or the partial reflector blank 600 is an AlGaAs/GaAs partial DBR wafer.

Figure 7:
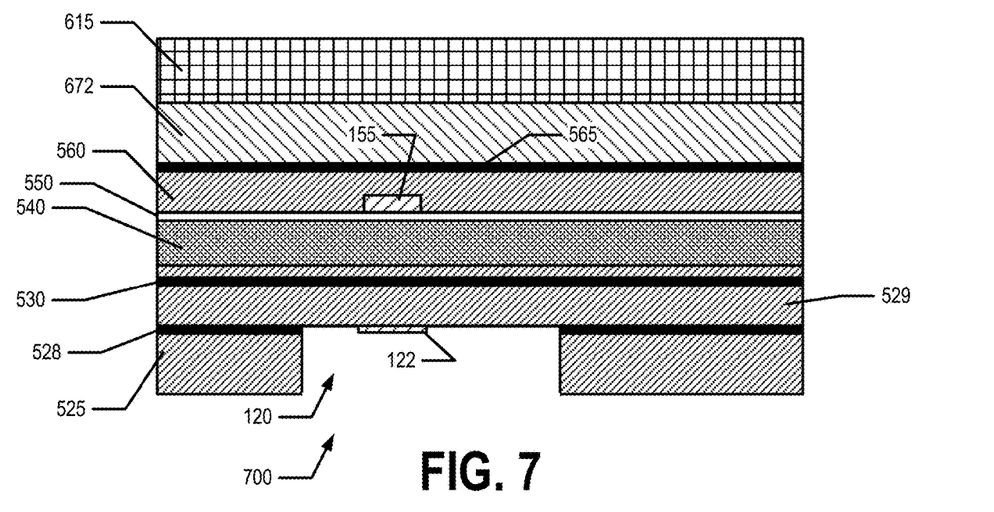
FIG. 7 illustrates a schematic cross-section of a partial reflector-VCSEL blank etched to define a tuning cavity, according to an example embodiment.

Continuing with FIG. 4, at block 406, etching is performed to remove the substrate 590 and the etch stop layer 595 and to form the tuning cavity 120 and the spacer layer 125 from the spacer layer blank 525. For example, the partial reflector-VCSEL blank 650 is etched to remove the substrate 590 and the etch stop layer 595 and to form the tuning cavity 120 and the spacer layer 125 from the spacer layer blank 525. For example, the partial reflector-VCSEL blank 650 may be etched to form an etched blank 700, as shown in FIG. 7. In an example embodiment, an etched blank 700 comprises a substrate 615, a partial reflector blank 672, a second contact layer blank 565, a second current-spreading layer blank 560, a tunnel junction 155, a p-type layer blank 550, an active region blank 540, a first contact layer blank 530, a first current-spreading layer bank 529, and a spacer layer 125 having a tuning cavity 120 etched therein. An antireflective coating 122 is deposited and/or applied to a surface on the interior of the tuning cavity 120. In an example embodiment, the anti-reflective coating 122 is applied to a portion of the first surface of the first current-spreading layer blank 529. For example, the first surface of the first current-spreading layer blank 529 may define a second boundary of the tuning cavity 120. The anti-reflective coating 122 is applied to the second boundary of the tuning cavity 120 such that the anti-reflective coating 122 is facing into the interior of the tuning cavity 120. The anti-reflective coating 122 is configured to match the semiconductor and air cavities for reaching a maximum tuning range of the VCSEL 100. The diameter of the anti-reflective coating 122 is the coating diameter $D_C$.

Figure 8:
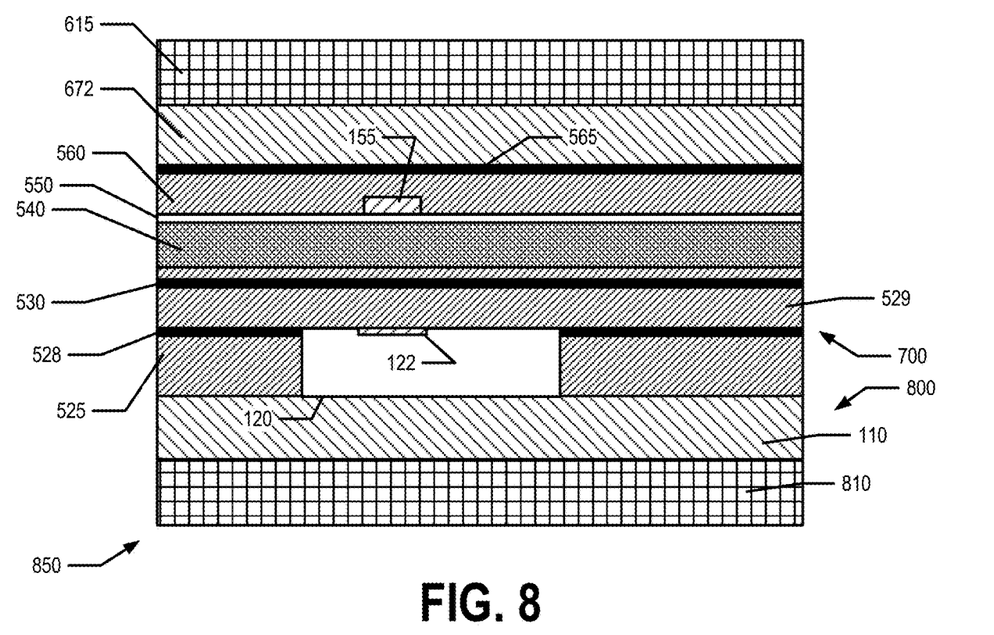
FIG. 8 illustrates a schematic cross-section of a partial reflector-VCSEL-output coupling mirror blank that comprises a tuning cavity.

Returning to FIG. 4, at block 408, an output coupling reflector wafer 800 is bonded to the etched blank 700 to form a reflector-cavity-reflector blank 850, as shown in FIG. 8. In an example embodiment, the output coupling reflector wafer 800 comprises an output coupling reflector 110 and a substrate 810. In an example embodiment, the substrate 810 is a GaAs substrate. In an example embodiment, the output coupling reflector 110 comprises a flexible DBR mirror blank. In various embodiments, the reflector-cavity-reflector blank 850 comprises a substrate 615, a partial reflector blank 672, a second contact layer blank 565, a second current-spreading layer blank 560, a tunnel junction 155, a p-type layer blank 550, an active region blank 540, a first contact layer blank 530, a first current-spreading layer blank 529, a spacer layer 125 having a tuning cavity 120 etched therein, an output coupling reflector 110, and a substrate 810.

Continuing with FIG. 4, at block 410, the reflector-cavity-reflector blank 850 is etched to form the first and second structural mesas 185A, 185B and the emission mesa 180. For example, the reflector-cavity-reflector blank 850 may be dry-etched to define one or more mesas (e.g., 185A, 185B, and/or 180). For example, the reflector-cavity-reflector blank 850 comprises a first current-spreading layer blank 529. In various embodiments, the reflector-cavity-reflector blank 850 is etched to remove the substrate 615. For example, the reflector-cavity-reflector blank 850 comprises a partial reflector blank 672 that is etched to form the partial reflector 172 and a portion of the structural mesas 185A, 185B. In an example embodiment, the reflector-cavity-reflector blank 850 is dry etched in Ar—$SiCl_4$ plasma. In an example embodiment, the reflector-cavity-reflector blank 850 is dry etched using a photoresist or dielectric mask. In an example embodiment, the center of the masked region is aligned with the center of the tunnel junction 155. In an example embodiment, the dry etching is used to define at least a portion of the structural mesas 185A, 185B and emission mesa 180. In an example embodiment, the dry-etching is ceased when the second contact layer 165 is exposed.

In an example embodiment, a portion of the etching of the reflector-cavity-reflector blank 850 comprises wet etching. For example, wet etching may be used to define and/or form the active region 140. For example, in an example embodiment, the wet etching is done by selective chemical etching in $H3PO4-H2O2-H2O$ solutions until reaching the first contact layer 130. For example, the reflector-cavity-reflector blank 850 may comprise a second current spreading layer blank 560 and a second contact layer blank 565 to form a second current-spreading layer 160, a second contact layer 165, and a portion of the structural mesas 185A, 185B. For example, the reflector-cavity-reflector blank 850 may comprise an active region blank 540 and a p-type layer blank 550 that are etched to form an active region 140, a p-type layer 150, and a portion of the structural mesas 185A, 185B. The first current-spreading layer 129 may be formed from at least a portion of the first current-spreading layer blank 529. For example, the reflector-cavity-reflector blank 850 may comprise a first contact layer blank 530. The first contact layer 130 may be formed from at least a portion of the first contact layer blank 530. At block 410, wet etching is used to define and/or form the first and second structural mesas 185A, 185B and emission mesa 180. For example the reflector-cavity-reflector blank 850 may be etched (e.g., by selective chemical etching in $H3PO4-H2O2-H2O$ solutions) until the first contact layer 130 is reached.

At block 412, dielectric material 103 is deposited. For example, chemical vapor deposition may be used to deposit the dielectric material 103. In an example embodiment, the dielectric material 103 is $Si_3N_4$. The dielectric material 103 electrically and chemically passivates all of the interfaces that were exposed during the etching steps. The dielectric material 103 also serves as a dielectric for contact window definition. The metal reflector 174 may then be formed by depositing metal on the dielectric material 103 of the emission mesa 180. In an example embodiment, the metal reflector comprises a first layer comprising Ti and a second layer comprising Au, such that the first layer acts as an adhesion layer between the dielectric material 103 and the second layer. In an example embodiment, the metal reflector 174 is formed by depositing 5 nm of Ti and 100 nm of Au on the dielectric material 103 of the emission mesa 180.

The contact windows may then be opened. For example, a first contact window and a second contact window may be opened in the dielectric material 103 such that the conductive layers 104 may be deposited and may be in electrical contact with the first contact layer 130 and the second contact layer 165. For example, a conductive metal layer 104 may be deposited in each contact window and configured to provide electrical communication to the first and second contact layers 165, 130, respectively. The conductive layer 104 is formed at step 414. First and second contact pads 106A and 106B are formed on the top of structural mesas 185A, 185B and the third metal pad 108 is formed on the top of the emission mesa 180 at step 414 as well. The first contact pad 106A is in electrical communication with the first contact layer 130 via a conductive layer 104 and the second contact pad 106B is in electrical communication with the second contact layer 165 via another conductive layer 104.

As should be understood in view of the present disclosure, host wafer VCSEL 100 can be formed or manufactured using a host wafer 200 in block 416. As a result, the first contact pad 106A is secured to a bump 206A of first conductive line 204A of a host wafer 200, and the second contact pad 106B is secured to a bump 206B of second conductive line 204B of the host wafer 200. Additionally, the third metal pad 108 is affixed to a central bump 206C of the host wafer 200 while still having substrate 810 in place. In an example embodiment, after securing first contact pad 106A to a bump 206A of first conductive line 204A of a host wafer 200, securing the second contact pad 106B to a bump 206B of second conductive line 204B of the host wafer 200, and affixing the third metal pad 108 to a central bump 206C of the host wafer, the substrate 810 is removed using chemical etching. In an example embodiment, the tuning electrode 113 may then be deposited and/or formed on the first surface of the flexible output coupling mirror 110. In an example embodiment, the tuning electrode 113 is deposited so as to define the window 114. In an example embodiment, the window 114 is defined by a photoresist lift-off after the tuning electrode is deposited and/or formed on the first surface of the flexible output coupling mirror 110. In an example embodiment part of the output coupling mirror 110 outside emission aperture 115 is etched to increase its flexibility and let air into and/or out of the tuning cavity 120.

Figure 10:
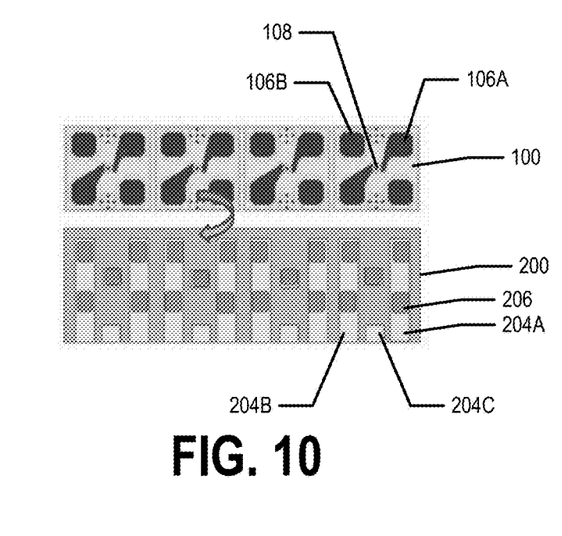
FIG. 10 illustrates a schematic of an array of VCSELs and a board to which the array of VCSELs are to be mounted, in an example embodiment.

FIG. 10 shows a host wafer 200 having conductive lines 204A and 204B with bonding bumps 206. For example, the bonding bumps 206 may be reflowed solder bumps for mechanically securing the first contact 106A in electrical communication with the first conductive line 204A and the second contact 106B in electrical communication with the second conductive line 204B. The third conductive line 204C may be placed into electrical contact with the tuning contact 113 via wire bonding and/or the like.

Multi-Beam Emission Device

Figure 11A:
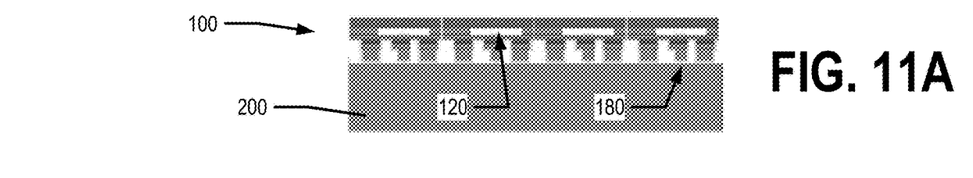
FIGS. 11A and 11B provide schematic views of an array of VCSELs mounted to a board, according to an example embodiment, where
Figure 11B:
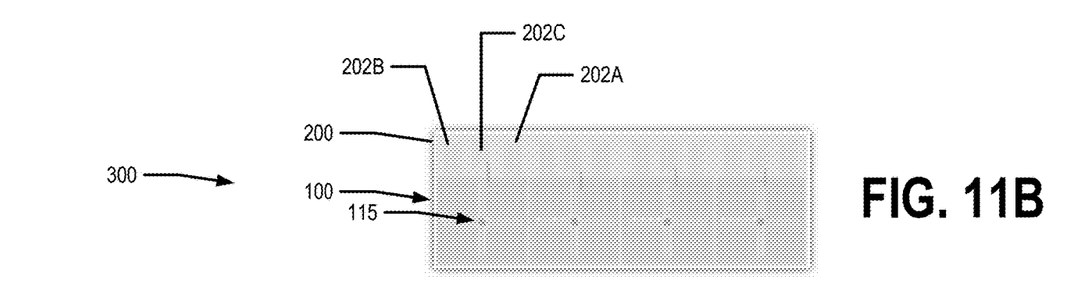
Figure 12:
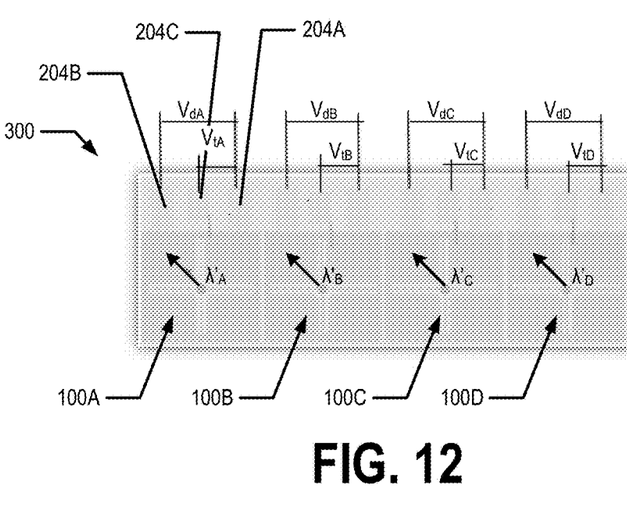
FIG. 12 illustrates a schematic of an example biasing scheme of the host wafer-mounted VCSEL array shown in FIGS. 11A and 11B.

In various embodiments, a plurality of host wafer-mounted VCSELs 100 form a multi-beam emission device 300. FIGS. 11A, 11B, and 12 provide various views of a multi-beam emission device 300. A VCSEL driver may be in electrical communication with the first and second conductive lines 204A, 204B so as to drive emission of light 1 from the VCSEL 100 having the first and second contact pads 106A, 106B secured to the first and second conductive lines 204A, 204B (e.g., via bonding bumps 206) by applying a driving voltage $V_d$ to the first and second contact pads 106A, 106B of the VCSEL 100. In an embodiment, a tuning voltage source applies a tuning voltage $V_t$, as measured with respect to the voltage applied to the first conductive line 204A, to the third conductive line 204C. In various embodiments, the tuning voltage $V_t$ is applied, via the third conductive line 204C, to the tuning contact 113 to tune the emission wavelength λ' of the VCSEL 100 and the driving voltage $V_d$ is applied, via the first and second conductive lines 204A, 204B, to the first and second contact pads 106A, 106B, respectively, to cause the emission of light 1 (of emission wavelength λ') from the VCSEL 100. In various embodiments, the light 1 emitted by the VCSEL 100 is emitted through the emission aperture 115 and coupled into an optical fiber, waveguide, and/or the like for transmission, processing, and/or the like.

In various embodiments, a plurality of VCSELS 100 (e.g., 100A, 100B, 100C, 100D) are mounted to the host wafer 200. In various embodiments, each VCSEL 100 (e.g., 100A, 100B, 100C, 100D) is tuned (e.g., via the corresponding tuning voltage $V_{tA}$, $V_{tB}$, $V_{tC}$, $V_{tD}$) to a distinct emission wavelength λ' (e.g., $\lambda'_A$, $\lambda'_B$, $\lambda'_C$, $\lambda'_D$). In various embodiments, the tuning voltage $V_t$ applied to a VCSEL 100 is up to 10V. For example, in various embodiments, $0V \le V_t \le 10V$. For example, if eight VCSELs 100 are mounted to the host wafer 200 to form a multi-beam emission device 300, each of the eight VCSELs 100 may emit a different wavelength such that the multi-beam emission device 300 emits eight distinct wavelengths. A set of wavelengths are distinct if each wavelength of the set of wavelengths is different (e.g., measurably different) from each other wavelength of the set of wavelengths. For example, Table 1 describes the set of wavelengths of a multi-beam emission device 300 having eight distinct wavelengths and a nominal wavelength λ of 1310 nm.

TABLE 1

| Lane | Center Frequency (THz) | Center Wavelength λ' (nm) | Wavelength Range (nm) |
|------|------------------------|---------------------------|------------------------|
| L0 | 235.4 | 1273.55 | 1272.55-1274.54 |
| L1 | 234.6 | 1277.89 | 1276.89-1278.89 |
| L2 | 233.8 | 1282.26 | 1281.25-1283.28 |
| L3 | 233.0 | 1286.66 | 1285.65-1287.69 |
| L4 | 231.4 | 1295.56 | 1294.53-1296.59 |
| L5 | 230.6 | 1300.05 | 1299.02-1301.09 |
| L6 | 229.8 | 1304.58 | 1303.54-1305.63 |
| L7 | 229.0 | 1309.14 | 1308.09-1310.19 |

In various embodiments, the VCSEL array of the multi-beam emission device 300 are driven and/or operated by an array of VCSEL drivers and tuned via an array of tuning voltage suppliers. For example, the VCSELs 100 of the multi-beam emission device 300 are tuned (e.g., via application of tuning voltages $V_t$) such that each emission wavelength of the multi-beam emission device 300 is spaced apart by 4-5 nm. For example, $\lambda'_A - \lambda'_B = 4$-5 nm, in an example embodiment, where $\lambda'_A$ and λ' are consecutive wavelengths (e.g., there are no other emission wavelengths λ' emitted by the multi-beam emission device 300 having a wavelength between $\lambda'_A$ and $\lambda'_B$). In an example embodiment, the VCSELs 100 (e.g., 100A, 100B, 100C, 100D) of the multi-beam emission device 300 are each configured to emit a signal (encoded in light 1) of a distinct emission wavelength λ' (e.g., $\lambda'_A$, $\lambda'_B$, $\lambda'_D$) that is coupled into an optical fiber, waveguide, and/or the like for multiplexing (e.g., via WDM), transmission, processing, and/or the like. For example, an optical fiber, waveguide, and/or the like may be mechanically coupled to the window 114 and/or the emission aperture 115 such that light 1 emitted by each VCSEL 100 is coupled into the optical fiber, waveguide, and/or the like.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A tunable vertical-cavity surface-emitting laser (VCSEL) comprising:
    an output coupling mirror;
    a high reflectivity mirror;
    an active cavity material structure disposed between the output coupling mirror and the high reflectivity mirror, the active cavity material structure comprising:
        a first current-spreading layer in electrical communication with a first contact pad,
        a second current-spreading layer in electrical communication with a second contact pad, wherein the first and second contact pads are disposed adjacent to the high reflectivity mirror,
        an active region disposed between the first current-spreading layer and the second current-spreading layer, and
        a tunnel junction overgrown by the second current-spreading layer, wherein the tunnel junction is disposed adjacent the active region; and
    a spacer layer disposed between the output coupling mirror and the active cavity material structure, a tuning cavity defined within the spacer layer, the tuning cavity being disposed along an emission axis of the VCSEL, wherein the spacer layer is disposed on a second surface of the output coupling mirror;
    a tuning electrode disposed on a first surface of the output coupling mirror, the first surface of the output coupling mirror opposite the second surface of the output coupling mirror, wherein a wavelength of light emitted by the VCSEL is tunable via application of a tuning voltage to the tuning electrode of the VCSEL.

2. The VCSEL of claim 1, wherein the tuning electrode comprises a window about the emission axis of the VCSEL, the window is centered with an emission aperture of the VCSEL.

3. The VCSEL of claim 1, wherein the tuning cavity is a cavity within the spacer layer filled with a gas.

4. The VCSEL of claim 3, wherein the gas is air.

5. The VCSEL of claim 3, wherein a height of the tuning cavity in a direction parallel to the emission axis is in the range of approximately λ/2 to 3λ/2, wherein λ is the wavelength of the light emitted by the VCSEL in the gas.

6. The VCSEL of claim 1, wherein the high reflectivity mirror is a composite mirror comprising a partial semiconductor distributed Bragg reflector mirror and a metal reflector.

7. The VCSEL of claim 1, wherein the output coupling mirror comprises a semiconductor distributed Bragg reflector.

8. The VCSEL of claim 1, wherein the tuning cavity is defined, in a direction parallel to the emission axis, by a second surface of the output coupling mirror and a first surface of the first current-spreading layer, and wherein an anti-reflective coating is disposed on at least a portion of the first surface of the first current-spreading layer such that the anti-reflective coating is facing the second surface of the output coupling mirror.

9. The VCSEL of claim 1 further comprising:
a first contact and a second contact, wherein the first contact pad and the second contact pad comprise the anode and cathode contact pads, wherein the first contact is in electrical communication with the first current-spreading layer and the second contact is in electrical communication with the second current-spreading layer.

10. The VCSEL of claim 9, wherein (a) the VCSEL comprises a first structural mesa, a second structural mesa, and an emission mesa, the emission mesa comprising the high reflectivity mirror and the active cavity material structure, (b) the first contact is disposed on the first structural mesa, (c) the second contact is disposed on the second structural mesa, and (d) a third metal pad is disposed on the emission mesa.

11. A vertical cavity surface emitting laser (VCSEL) array, comprising:
a VCSEL driver array comprising a plurality of VCSEL drivers and corresponding leads;
one or more tuning voltage suppliers and corresponding leads;
a plurality of tunable VCSELs, each VCSEL comprising:
an output coupling mirror;
a high reflectivity mirror;
an active cavity material structure disposed between the output coupling mirror and the high reflectivity mirror, the active cavity material structure comprising:
a first current-spreading layer,
a second current-spreading layer,
an active region disposed between the first current-spreading layer and the second current-spreading layer, and
a tunnel junction overgrown by the second current-spreading layer, wherein the tunnel junction is disposed adjacent the active region;
a spacer layer disposed between the output coupling mirror and the active cavity material structure, a tuning cavity defined within the spacer layer, the tuning cavity being disposed along an emission axis of the VCSEL, the spacer layer disposed on a second surface of the output coupling mirror;
a tuning electrode disposed on a first surface of the output coupling mirror, the first surface of the output coupling mirror being opposite the second surface of the output coupling mirror;
a first contact pad and a second contact pad, the first and second contact pads comprising an anode contact pad and a cathode contact pad, wherein the first contact pad is in electrical communication with the first current-spreading layer and the second contact pad is in electrical communication with the second current-spreading layer, wherein:
the first and second contact pads are secured in electrical communication with a pair of leads corresponding to a driver of the plurality of drivers,
the tuning electrode is in electrical communication with a tuning voltage supplier of the one or more tuning voltage suppliers,
a wavelength of light emitted by the VCSEL is tunable via application of a tuning voltage to the tuning electrode of the VCSEL by the tuning voltage supplier, and
the plurality of VCSELs and the one or more tuning voltage suppliers are configured such that each VCSEL emits light of a distinct wavelength.

12. The VCSEL array of claim 11, wherein the tuning cavity of each VCSEL is a cavity within the respective spacer layer filled with a gas.

13. The VCSEL array of claim 12, wherein a height of the tuning cavity in a direction parallel to the emission axis is in the range of approximately $\lambda/2$ to $3\lambda 2$, wherein $\lambda$ is the wavelength of the light emitted by the VCSEL in the gas.

14. The VCSEL array of claim 11, wherein the high reflectivity mirror of each VCSEL is a composite mirror comprising a partial semiconductor distributed Bragg reflector mirror and a metal reflector.

15. The VCSEL array of claim 11, wherein the output coupling mirror of each VSCEL comprises a semiconductor distributed Bragg reflector.

16. The VCSEL array of claim 11, wherein the tuning cavity of each VCSEL is defined, in a direction parallel to the emission axis, by a second surface of the output coupling mirror and a first surface of the first current-spreading layer, and wherein an antireflective coating is disposed on at least a portion of the first surface of the first current-spreading layer such that the antireflective coating is facing the second surface of the output coupling mirror.

17. The VCSEL array of claim 11, wherein the plurality of VCSELs comprises at least eight VCSELs and each of the plurality of VCSELs is configured to provide a signal to a multiplexer configured to multiplex a plurality of signals into one optical fiber.

18. A method for manufacturing a tunable vertical cavity surface emitting laser (VCSEL), the method comprising:
providing a partial reflector-VCSEL blank comprising:
a spacer layer blank,
an etch stop layer,
a partial reflector blank, and
an active cavity material structure blank disposed between the etch stop layer and the partial reflector blank, the etch stop line disposed between the spacer layer blank and the active cavity material structure blank, wherein the spacer layer blank, the etch stop layer, the active cavity material structure blank, and the partial reflector blank are stacked in a direction along an emission axis of the VCSEL;
etching the spacer layer blank and the etch stop line to define a tuning cavity within the spacer layer blank;
bonding an output coupling mirror to a surface of the spacer layer opposite the etch stop layer;
etching the partial reflector blank and the active cavity material structure blank to form an emission structure comprising:
a partial reflector,
a first current-spreading layer,
a second current-spreading layer,
an active region disposed between the first current-spreading layer and the second current-spreading layer, and
a tunnel junction overgrown by the second current-spreading layer, wherein the tunnel junction is disposed adjacent the active region;
depositing first and second contact pads and a third metal pad,
and a tuning electrode, wherein the first contact is in electrical communication with the first current-spreading layer, the second contact is in electrical communication with the second current-spreading layer, the tuning electrode defining a window centered with an emission aperture of the VCSEL, and wherein application of a tuning voltage to the tuning electrode causes tuning of a wavelength of light emitted by the VCSEL.

19. The method of claim 18, wherein the tuning cavity is a cavity filled with air and a height of the tuning cavity in a direction parallel to the emission axis is in the range of approximately $\lambda/2$ to $3\lambda/2$, wherein $\lambda$ is the wavelength of the light emitted by the VCSEL in the gas.

20. The method of claim 18, further comprising depositing an antireflective coating on at least a portion of a surface that (a) defines a boundary of the tuning cavity and (b) defines a plane transverse to the emission axis of the VCSEL.

\* \* \* \* \*